US008829654B2

(12) United States Patent
Zhao et al.

(10) Patent No.: US 8,829,654 B2
(45) Date of Patent: Sep. 9, 2014

(54) SEMICONDUCTOR PACKAGE WITH INTERPOSER

(71) Applicant: Broadcom Corporation, Irvine, CA (US)

(72) Inventors: Sam Ziqun Zhao, Irvine, CA (US); Rezaur Rahman Khan, Rancho Santa Margarita, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 14/078,799

(22) Filed: Nov. 13, 2013

(65) Prior Publication Data

US 2014/0061886 A1    Mar. 6, 2014

Related U.S. Application Data

(63) Continuation of application No. 13/665,634, filed on Oct. 31, 2012, now Pat. No. 8,587,132, which is a continuation-in-part of application No. 13/401,457, filed on Feb. 21, 2012, now Pat. No. 8,558,395.

(51) Int. Cl.
| | |
|---|---|
| *H01L 29/40* | (2006.01) |
| *H01L 23/02* | (2006.01) |
| *H01L 23/48* | (2006.01) |
| *H01L 23/52* | (2006.01) |
| *H01L 21/48* | (2006.01) |
| *H01L 23/522* | (2006.01) |
| *H01L 23/538* | (2006.01) |
| *H01L 23/498* | (2006.01) |
| *H01L 23/00* | (2006.01) |
| *H01L 25/065* | (2006.01) |

(52) U.S. Cl.
CPC ........... *H01L 23/481* (2013.01); *H01L 21/4857* (2013.01); *H01L 23/5226* (2013.01); *H01L 23/5384* (2013.01); *H01L 23/5385* (2013.01); *H01L 23/5389* (2013.01); *H01L 23/49827* (2013.01); *H01L 23/49833* (2013.01); *H01L 24/97* (2013.01); *H01L 25/0657* (2013.01); *H01L 2224/14183* (2013.01); *H01L 2224/30183* (2013.01); *H01L 2225/06541* (2013.01); *H01L 2225/06572* (2013.01)

USPC ........... 257/621; 257/686; 257/777; 257/778; 257/E21.597; 257/E23.011; 257/E23.085; 257/E23.174

(58) Field of Classification Search
CPC .............. H01L 21/4857; H01L 23/481; H01L 23/5226; H01L 23/5384; H01L 23/5385; H01L 23/5389; H01L 23/49827; H01L 23/49833; H01L 24/97; H01L 25/0657; H01L 2224/14183; H01L 2224/30183; H01L 2225/06541; H01L 2225/06572
USPC .................. 257/621, 686, 777, 778, E21.597, 257/E23.011, E23.085, E23.174
See application file for complete search history.

(56) References Cited

U.S. PATENT DOCUMENTS

| 5,198,963 A | 3/1993 | Gupta et al. |
| 6,002,168 A | 12/1999 | Bellaar et al. |

(Continued)

FOREIGN PATENT DOCUMENTS

| KR | 10-2011-0036249 | 4/2011 |
| WO | WO-2009/017758 A2 | 2/2009 |

*Primary Examiner* — Ida M Soward
(74) *Attorney, Agent, or Firm* — McDermott Will & Emery LLP

(57) ABSTRACT

The present application discloses various implementations of a semiconductor package including an organic substrate and one or more interposers having through-semiconductor vias (TSVs). Such a semiconductor package may include a contiguous organic substrate having a lower substrate segment including first and second pluralities of lower interconnect pads, the second plurality of lower interconnect pads being disposed in an opening of the lower substrate segment. The contiguous organic substrate may also include an upper substrate segment having an upper width and including first and second pluralities of upper interconnect pads. In addition, the semiconductor package may include at least one interposer having TSVs for electrically connecting the first and second pluralities of lower interconnect pads to the first and second pluralities of upper interconnect pads. The interposer has an interposer width less than the upper width of the upper substrate segment.

20 Claims, 10 Drawing Sheets

(56) References Cited

U.S. PATENT DOCUMENTS

| | | |
|---|---|---|
| 6,188,578 B1 | 2/2001 | Lin et al. |
| 6,286,208 B1 * | 9/2001 | Shih et al. ............... 29/879 |
| 6,461,895 B1 | 10/2002 | Liang et al. |
| 6,709,898 B1 | 3/2004 | Ma et al. |
| 6,743,661 B1 | 6/2004 | Drewery |
| 6,791,195 B2 | 9/2004 | Urushima |
| 6,952,049 B1 | 10/2005 | Ogawa et al. |
| 7,220,667 B2 | 5/2007 | Yamagata |
| 7,262,615 B2 | 8/2007 | Cheng et al. |
| 7,585,702 B1 | 9/2009 | Wang et al. |
| 7,675,163 B2 | 3/2010 | Heydari et al. |
| 7,834,450 B2 | 11/2010 | Kang |
| 7,838,337 B2 | 11/2010 | Marimuthu et al. |
| 7,901,986 B2 | 3/2011 | Arai et al. |
| 8,008,125 B2 | 8/2011 | McConnelee et al. |
| 8,021,927 B2 | 9/2011 | Khan et al. |
| 8,022,555 B2 | 9/2011 | Hwang et al. |
| 8,133,761 B2 | 3/2012 | Gerber et al. |
| 8,188,594 B2 | 5/2012 | Ganesan et al. |
| 8,202,763 B2 | 6/2012 | Meyer et al. |
| 8,310,063 B2 | 11/2012 | Wang |
| 8,344,516 B2 | 1/2013 | Chainer |
| 8,461,672 B2 | 6/2013 | Haba et al. |
| 8,541,886 B2 * | 9/2013 | Chin ............... 257/777 |
| 8,618,669 B2 * | 12/2013 | Furuta ............... 257/777 |
| 8,689,437 B2 * | 4/2014 | Dang et al. ............... 29/842 |
| 2002/0030261 A1 | 3/2002 | Rolda et al. |
| 2003/0036219 A1 | 2/2003 | Masumoto et al. |
| 2005/0067714 A1 * | 3/2005 | Rumer et al. ............... 257/778 |
| 2005/0218518 A1 | 10/2005 | Jiang et al. |
| 2005/0248015 A1 * | 11/2005 | Palanduz ............... 257/684 |
| 2006/0145328 A1 | 7/2006 | Hsu |
| 2006/0186531 A1 | 8/2006 | Hsu |
| 2006/0186536 A1 | 8/2006 | Hsu |
| 2006/0220262 A1 | 10/2006 | Meyer et al. |
| 2006/0244470 A1 | 11/2006 | Shinde et al. |
| 2006/0258044 A1 | 11/2006 | Meyer et al. |
| 2007/0132082 A1 | 6/2007 | Tang et al. |
| 2007/0209831 A1 | 9/2007 | Sakamoto et al. |
| 2007/0273049 A1 | 11/2007 | Khan et al. |
| 2007/0290376 A1 | 12/2007 | Zhao et al. |
| 2008/0044944 A1 | 2/2008 | Wakisaka et al. |
| 2008/0128882 A1 * | 6/2008 | Baek et al. ............... 257/686 |
| 2008/0157322 A1 | 7/2008 | Tang et al. |
| 2008/0157328 A1 | 7/2008 | Kawata |
| 2008/0246138 A1 | 10/2008 | Gerber et al. |
| 2008/0268638 A1 | 10/2008 | Dertinger et al. |
| 2009/0053858 A1 | 2/2009 | Ko et al. |
| 2009/0102030 A1 | 4/2009 | Khan et al. |
| 2009/0140415 A1 | 6/2009 | Furuta |
| 2009/0275173 A1 * | 11/2009 | Thurgood ............... 438/118 |
| 2010/0013073 A1 * | 1/2010 | Andry et al. ............... 257/686 |
| 2010/0019360 A1 | 1/2010 | Khan et al. |
| 2010/0084754 A1 | 4/2010 | Yoo et al. |
| 2010/0133534 A1 | 6/2010 | Do et al. |
| 2010/0301474 A1 | 12/2010 | Yang |
| 2011/0024888 A1 | 2/2011 | Pagaila et al. |
| 2011/0024906 A1 | 2/2011 | Meyer et al. |
| 2011/0115082 A1 * | 5/2011 | Gluschenkov et al. ....... 257/738 |
| 2011/0241185 A1 | 10/2011 | Koester et al. |
| 2011/0254160 A1 | 10/2011 | Tsai et al. |
| 2011/0272819 A1 | 11/2011 | Park et al. |
| 2011/0278732 A1 | 11/2011 | Yu et al. |
| 2011/0285030 A1 | 11/2011 | Meyer et al. |
| 2012/0009738 A1 | 1/2012 | Crawford et al. |
| 2012/0018899 A1 | 1/2012 | Pagaila et al. |
| 2012/0062439 A1 | 3/2012 | Liao et al. |
| 2012/0139105 A1 | 6/2012 | Lin et al. |
| 2012/0147578 A1 * | 6/2012 | Jin et al. ............... 361/774 |
| 2012/0152605 A1 | 6/2012 | Das et al. |
| 2012/0168942 A1 | 7/2012 | Gan et al. |
| 2012/0211885 A1 | 8/2012 | Choi et al. |
| 2012/0223429 A1 | 9/2012 | Khan et al. |
| 2012/0225522 A1 | 9/2012 | Zhao et al. |
| 2012/0228753 A1 | 9/2012 | Ko et al. |
| 2012/0241921 A1 | 9/2012 | Lee et al. |
| 2012/0292785 A1 | 11/2012 | Pagaila et al. |
| 2012/0313240 A1 | 12/2012 | Cheng et al. |
| 2012/0319248 A1 * | 12/2012 | Rahman ............... 257/621 |
| 2012/0319284 A1 | 12/2012 | Ko et al. |
| 2012/0319293 A1 | 12/2012 | Cheah et al. |
| 2013/0000968 A1 | 1/2013 | Zhao et al. |
| 2013/0062764 A1 | 3/2013 | Jin |
| 2013/0075917 A1 | 3/2013 | Law et al. |
| 2013/0113098 A1 | 5/2013 | Hwang et al. |
| 2013/0147023 A1 | 6/2013 | Lin et al. |
| 2013/0181354 A1 | 7/2013 | Khan et al. |
| 2013/0200515 A1 * | 8/2013 | Hwang et al. ............... 257/737 |

* cited by examiner

SEMICONDUCTOR PACKAGE WITH INTERPOSER

This is a continuation of application Ser. No. 13/665,634 filed Oct. 31, 2012, entitled "Semiconductor Package Including an Organic Substrate and Interposer Having Through-Semiconductor Vias," issued as U.S. Pat. No. 8,587,132 on Nov. 19, 2013, which in turn is a continuation-in-part of application Ser. No. 13/401,457, filed Feb. 21, 2012, entitled "Organic Interface Substrate Having Interposer with Through-Semiconductor Vias," issued as U.S. Pat. No. 8,558,395 on Oct. 15, 2013. These disclosures are hereby incorporated by reference in their entireties.

BACKGROUND

In semiconductor packaging, package substrates, also referred to as interface substrates in the present application, are typically used to interface one or more semiconductor dies to a support surface such as a printed circuit board (PCB). Organic substrates have traditionally been used and continue to be used as interface substrates in a variety of packaging designs, such as ball grid array (BGA) packaging, chip scale package (CSP) solutions, and system-in-package (SiP) solutions.

Organic interface substrates are fabricated according to strict design rules that can raise packaging costs where multiple contact pad pitches are utilized. In addition, the minimum size of interconnect trace line widths, line to line spacing, and contact pad pitch characterizing conventional organic interface substrates can make integration of dies with high density input/output (I/O) arrays challenging.

SUMMARY

The present disclosure is directed to a semiconductor package including an organic substrate and interposer having through-semiconductor vias (TSVs), substantially as shown in and/or described in connection with at least one of the figures, and as set forth more completely in the claims.

DETAILED DESCRIPTION

Figure 1:
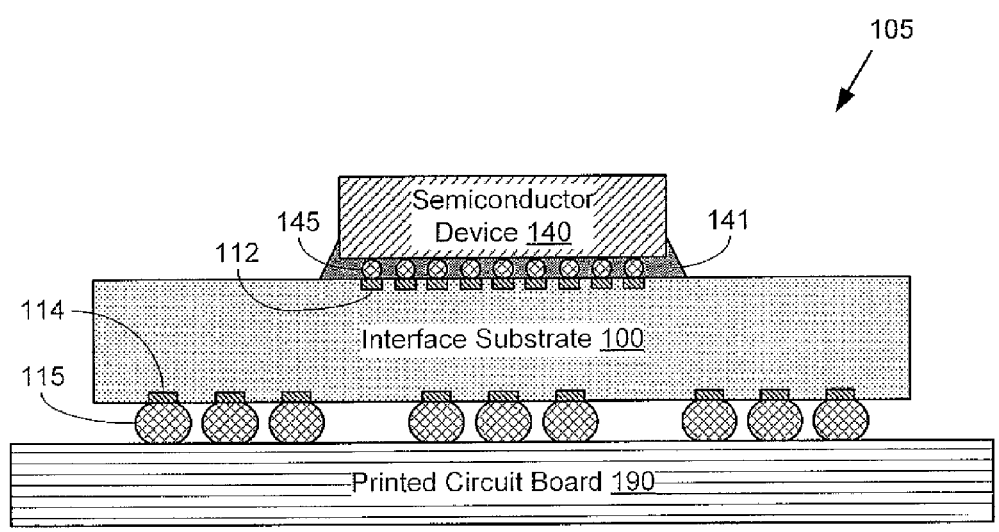
FIG. 1 presents a cross-sectional view of an exemplary semiconductor package using a conventional organic interface substrate.

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

FIG. 1 presents a cross-sectional view of an exemplary semiconductor package using a conventional organic interface substrate. FIG. 1 includes semiconductor package 105 (or "package 105") mounted on printed circuit board (PCB) 190. Package 105 includes organic interface substrate 100 and semiconductor device 140. Organic interface substrate 100 includes a plurality of upper contact pads 112, with an exemplary upper contact pad 112 explicitly identified as such. Organic interface substrate 100 also includes a plurality of lower contact pads 114, with an exemplary lower contact pad 114 explicitly identified as such.

The plurality of lower contact pads 114 are coupled to a respective plurality of solder balls 115, with an exemplary solder ball 115 explicitly identified as such. Semiconductor device 140 includes a plurality of microbumps 145, with an exemplary microbump 145 explicitly identified as such. The plurality of microbumps 145 are connected to the plurality of upper contact pads 112. Underfill 141 is situated below semiconductor device 140 to support and protect the plurality of microbumps 145, as well as semiconductor device 140.

Organic interface substrate 100 may be a conventional multi-layer organic substrate, functioning as an interconnection chip carrier for routing input/output (I/O) pads on semiconductor device 140 to PCB 190, or another support surface. As noted above, an organic interface substrate, such as organic interface substrate 100, is typically fabricated according to strict design rules. As a result, packaging costs may become undesirably high where multiple contact pad pitches are utilized. Moreover, the minimum size of interconnect trace line widths, line to line spacing, and contact pad pitch characterizing conventional organic interface substrates can make integration of dies with high density I/O arrays challenging.

Figure 2A:
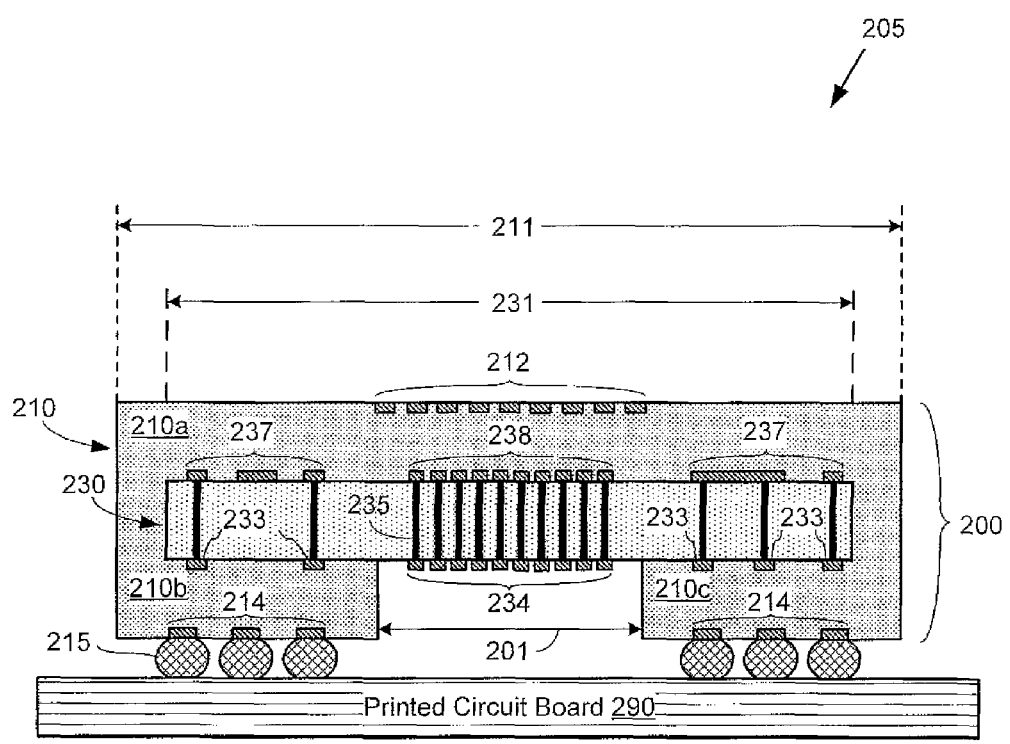
FIG. 2A presents a cross-sectional view of an exemplary semiconductor package including an organic substrate and an interposer having through-semiconductor vias (TSVs).

Referring to FIG. 2A, FIG. 2A presents a cross-sectional view of an exemplary semiconductor package including an organic substrate and an interposer having through-semiconductor vias (TSVs). Semiconductor package 205 (or "package 205") in FIG. 2A includes interface substrate 200 mounted on PCB 290. Interface substrate 200 includes contiguous organic substrate 210 having upper substrate segment 210a and lower substrate segment 210b and/or 210c. It is noted with respect to the exemplary packaging implementations shown in FIGS. 2A, 2B, 2C, and 2D, that "lower substrate segment" may refer to either, or both, of the features identified by reference numbers 210*b* and 210*c*. Interface substrate 200 also includes interposer 230 embedded in contiguous organic substrate 210.

Upper substrate segment 210*a* has a lateral upper width 211, and includes a plurality of upper contact pads 212, a first plurality of upper interconnect pads 237, and a second plurality of upper interconnect pads 238. Interposer 230 has a lateral interposer width 231 less than upper width 211 of upper substrate segment 210*a*. In addition, interposer 230 includes a plurality of TSVs 235, with an exemplary TSV 235 explicitly identified as such. Lower substrate segment 210*b* and 210*c* includes a first plurality of lower interconnect pads 233, a second plurality of lower interconnect pads 234, and a plurality of lower contact pads 214. The plurality of lower contact pads 214 are coupled to PCB 290 by a respective plurality of solder balls 215, with an exemplary solder ball 215 explicitly identified as such.

Upper substrate segment 210*a* and lower substrate segment 210*b* and 210*c* may be fabricated of organic materials such as Bismaleimide-Triazine (BT), Ajinomoto Build-up Film (ABF), FR-4 laminates, E679-FBG, ECL4785GS, and E700. Upper substrate segment 210*a* may utilize the same materials as lower substrate segment 210*b* and 210*c*. Upper substrate segment 210*a* and lower substrate segment 210*b* and 210*c* may each include multiple conductive laminate or build-up layers for wiring, as known in the art.

The first plurality of lower interconnect pads 233 may be electrically connected to the first plurality of upper interconnect pads 237 using TSVs 235 to route the pads in any desired manner. An opening 201 divides the lower portion of contiguous organic substrate 210 into lower substrate segment 210*b* and 210*c*, and exposes the second plurality of lower interconnect pads 234. The second plurality of lower interconnect pads 234 may be utilized as lower contact pads, for example, to receive a lower semiconductor die (lower semiconductor die not shown in FIG. 2A). The second plurality of lower interconnect pads 234 is capable of electrical connection to the second plurality of upper interconnect pads 238 using TSVs 235.

The plurality of upper contact pads 212 of upper substrate segment 210*a* are capable of electrical connection to the first and second pluralities of upper interconnect pads 237 and 238. For example, such electrical connection may be established through use of conductive wiring layers within upper substrate segment 210*a* that are not explicitly shown in FIG. 2A. Upper contact pads 212 may be implemented to receive an upper semiconductor die (upper semiconductor die also not shown in FIG. 2A).

Interposer 230 may be fabricated of a semiconductor material such as silicon. As a result, TSVs 235 may be through-silicon vias. Because high density through-silicon vias may be utilized, interposer 230 may provide a high density pad pitch for the first and/or second pluralities of upper interconnect pads 237 and 238, as well as for the first and/or second pluralities of lower interconnect pads 233 and 234. Thus, the second plurality of lower interconnect pads 234 may have a pitch of approximately fifty micrometers (50 um) or less. As a more specific example, the second plurality of lower interconnect pads 234 may have a pitch of approximately 20 um to approximately 40 um, allowing a lower semiconductor die with high density microbumps to be attached. Consequently, in one implementation, upper and lower semiconductor dies having different bump pitches may be supported by interface substrate 200. Moreover, interface substrate 200 may be configured to receive a lower semiconductor die with a high-density bump pitch less than, for example, approximately 130 um.

In one implementation, upper substrate segment 210*a* and lower substrate segment 210*b* and 210*c* may be fabricated separately. As a result, fabrication equipment may be matched to the requirements of each substrate segment. Fabrication of upper substrate segment 210*a* may require equipment supporting a pad pitch of, for example, at least 130 um for the plurality of upper contact pads 212. By contrast, fabrication of lower substrate segment 210*b* and 210*c* may only require equipment supporting a pad pitch of, for example, at least 300 um for the plurality of lower contact pads 214. In other words, a minimum pad pitch of upper substrate segment 210*a* may be less than a minimum pad pitch of lower substrate segment 210*b* and 210*c*.

Figure 2B:
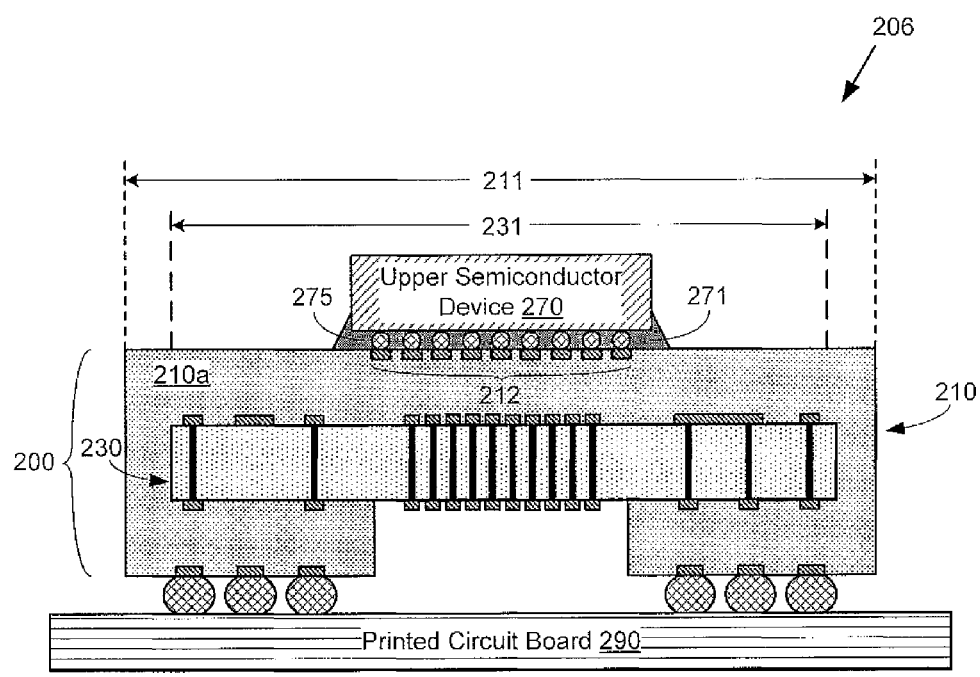
FIG. 2B presents a cross-sectional view of another exemplary semiconductor package including an organic substrate and an interposer having TSVs.

Continuing to FIG. 2B, FIG. 2B presents a cross-sectional view of an exemplary semiconductor package including an organic substrate and an interposer having TSVs. Package 206 includes interface substrate 200 and upper semiconductor device 270, and is mounted on PCB 290. Upper semiconductor device 270 includes a plurality of microbumps 275, with an exemplary microbump 275 explicitly identified as such. Underfill 271 is situated below upper semiconductor device 270 to support and insulate the plurality of microbumps 275.

Figure 2C:
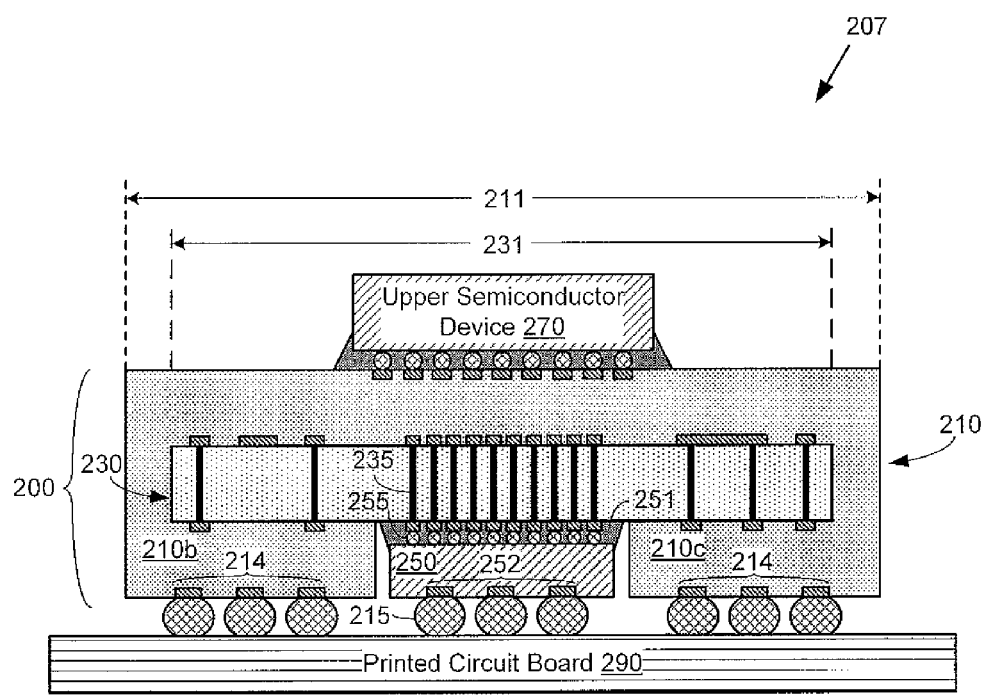
FIG. 2C presents a cross-sectional view of an exemplary multi-die semiconductor package including an organic substrate and an interposer having TSVs.
Figure 2D:
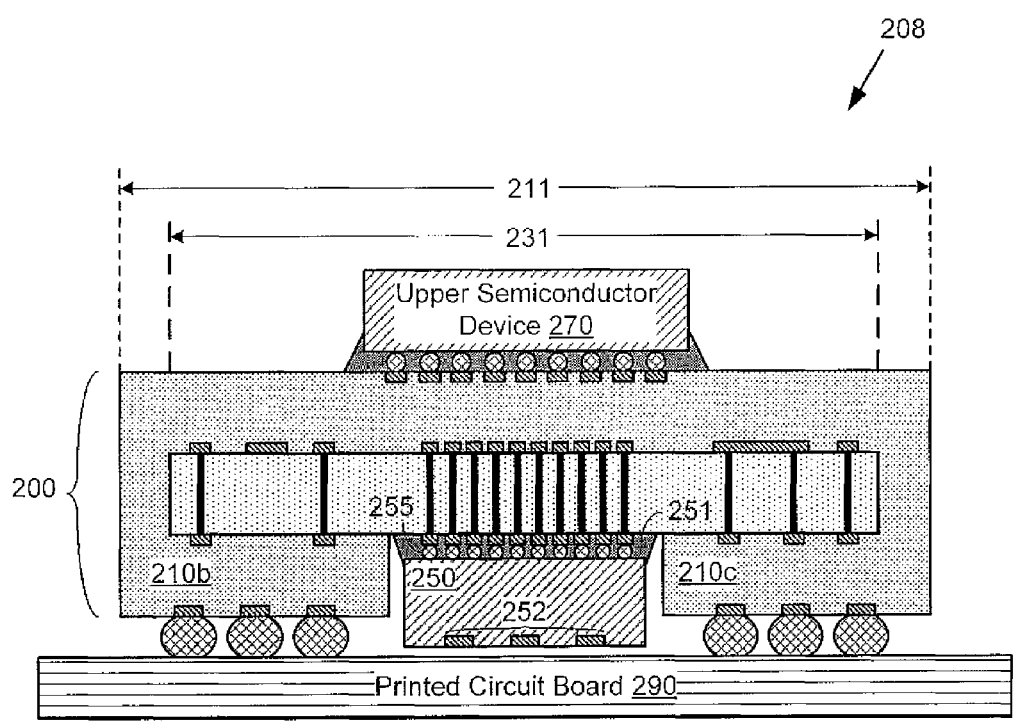
FIG. 2D presents a cross-sectional view of another exemplary multi-die semiconductor package including an organic substrate and an interposer having TSVs.

With respect to the detailed features of interface substrate 200, it is noted that interface substrate 200 in FIG. 2B, as well as subsequent FIGS. 2C and 2D, corresponds to interface substrate 200 in FIG. 2A. In other words, interface substrate 200 in FIGS. 2B, 2C, and 2D include the features previously attributed to interface substrate 200 by reference to FIG. 2A above. Moreover, it is reiterated that interposer 230 of interface substrate 200 has interposer width 231 less than upper width 211 of upper substrate segment 210*a*.

Upper substrate segment 210*a* includes the plurality of upper contact pads 212 for receiving upper semiconductor device 270, which, according to the implementation shown in FIG. 2B is configured as a flip-chip. However, in other implementations, upper semiconductor device 270 may include a wire-bonded die, and corresponding upper contact pads or fingers for the wire bonds may be provided on upper substrate segment 210*a*. Furthermore, while only a single upper semiconductor device 270 is shown in FIG. 2B, alternative implementations may mount multiple semiconductor devices onto the top surface of interface substrate 200. Thus, package 206 may be a hybrid package including both flip-chip and wire-bonded dies. Heat sinks and/or mold compound may also be applied to package 206, but are not shown in FIG. 2B. Accordingly, package 206 enables significant design flexibility through the capability of accommodating one or more semiconductor dies for connection to PCB 290 through interface substrate 200.

Moving to FIG. 2C, FIG. 2C presents a cross-sectional view of an exemplary multi-die semiconductor package including an organic substrate and an interposer having TSVs. Package 207 of FIG. 2C may correspond to package 206 of FIG. 2B with the addition of lower semiconductor device 250. Lower semiconductor device 250 includes die contact pads 252, and a plurality of microbumps 255, with an exemplary microbump 255 explicitly identified as such. Underfill 251 is situated between lower semiconductor device 250 and interposer 230 to support and protect the plurality of microbumps 255.

The plurality of solder balls 215 for connection of interface substrate 200 to PCB 290 may be extended to include additional solder balls connected to die contact pads 252 of lower semiconductor device 250. It is noted that although the plurality of solder balls 215 are all shown to have a substantially uniform size in FIG. 2C, the solder balls connected to die contact pads 252 and the solder balls connected to lower contact pads 214 may be of different sizes. For example, lower semiconductor device 250 may extend beyond lower substrate segment 210b and 210c, thereby necessitating smaller solder balls for die contact pads 252. Additionally, in some implementations, land grid arrays (LGAs) may be utilized instead of ball grid arrays (BGAs).

In some implementations, die contact pads 252 may be electrically inactive and provided for thermal dissipation only. Multiple semiconductor device dies may also be mounted onto the exposed bottom second plurality of lower interconnect pads 234 of lower substrate segment 210b and 210c, rather than only a single lower semiconductor device 250 as shown in FIG. 2C. Heat sink/heat spreader and/or mold compound may also be integrated into package 207, but are not shown in FIG. 2C.

As previously noted, because TSVs 235 of interposer 230 enable use of high-density contact pads having a pitch of, for example, approximately 20 um to approximately 40 um, upper and lower semiconductor dies with different contact pad densities may be readily supported. Accordingly, package 207 may support multiple dies of different pitches, including high-density pitches, for connection to PCB 290 through interface substrate 200. For example, upper semiconductor device 270 may have a microbump pitch of approximately 130 um to approximately 300 um, whereas lower semiconductor device 250 may have a microbump pitch of approximately 20 um to approximately 40 um. Moreover, package 207 may be constructed in a cost effective manner using well known organic substrate fabrication techniques and fabrication equipment tailored individually to the pitch requirements of the separate upper and lower organic substrate layers.

FIG. 2D presents a cross-sectional view of another exemplary multi-die semiconductor package including an organic substrate and an interposer having TSVs. With respect to FIG. 2D, package 208 differs from package 207, in FIG. 2C only in the decoupling of lower semiconductor device 250 from PCB 290. Thus, as shown in FIG. 2D, lower semiconductor device 250 may not necessarily connect to PCB 290. Moreover, and as noted above, lower semiconductor device 250 may extend beyond lower substrate segment 210b and 210c, as shown in FIG. 2D.

Figure 3A:
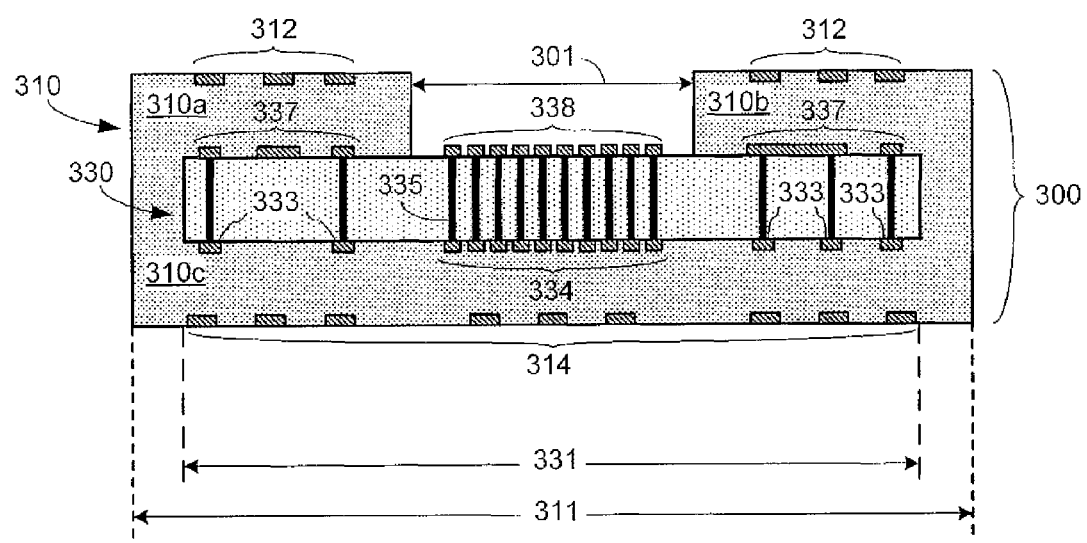
FIG. 3A presents a cross-sectional view of an exemplary interface substrate including an organic substrate and an interposer having TSVs, suitable for use in a semiconductor package.

Referring now to FIG. 3A, FIG. 3A presents a cross-sectional view of exemplary interface substrate 300 including contiguous organic substrate 310 and interposer 330 having TSVs 335. Interface substrate 300 includes contiguous organic substrate 310 having upper substrate segment 310a and/or 310b, and lower substrate segment 310c. It is noted with respect to the implementations shown in FIGS. 3A, 3B, 3C, and 3D, that "upper substrate segment" may refer to either, or both, of the features identified by reference numbers 310a and 310b. Interface substrate 300 also includes interposer 330 embedded in contiguous organic substrate 310.

Lower substrate segment 310c has a lateral lower width 311, and includes a plurality of lower contact pads 314, a first plurality of lower interconnect pads 333, and a second plurality of lower interconnect pads 334. Interposer 330 has a lateral interposer width 331 less than lower width 311 of lower substrate segment 310c. In addition, interposer 330 includes a plurality of TSVs 335, with an exemplary TSV 335 explicitly identified as such. Upper substrate segment 310a and 310b includes a first plurality of upper interconnect pads 337, a second plurality of upper interconnect pads 338, and a plurality of upper contact pads 312.

Upper substrate segment 310a and 310b, and lower substrate segment 310c may utilize the same materials as previously described with reference to the substrate segments shown in FIGS. 2A, 2B, 2C, and 2D. That is to say, upper substrate segment 310a and 310b, and lower substrate segment 310c may be formed of BT, ABF, FR-4 laminates, and the like. Moreover, upper substrate segment 310a and 310b, and lower substrate segment 310c may each include multiple conductive laminate or build-up layers for wiring.

The first plurality of lower interconnect pads 333 may be electrically connected to the first plurality of upper interconnect pads 337 using TSVs 335 to route the pads in any desired manner. An opening 301 divides the upper portion of contiguous organic substrate 310 into upper substrate segment 310a and 310b, and exposes the second plurality of upper interconnect pads 338. The second plurality of upper interconnect pads 338 may be utilized as upper contact pads, for example, to receive an upper semiconductor die (upper semiconductor die not shown in FIG. 3A). The second plurality of upper interconnect pads 338 is capable of electrical connection to the second plurality of lower interconnect pads 334 using TSVs 335.

The plurality of upper contact pads 312 of upper substrate segment 310a and 310b are capable of electrical connection to the first and second pluralities of upper interconnect pads 337 and 338. For example, such electrical connection may be established through use of conductive wiring layers within upper substrate segment 310a and 310b that are not explicitly shown in FIG. 3A. Upper contact pads 312 may be implemented to receive an upper semiconductor die or package (upper semiconductor die or package also not shown in FIG. 3A).

Like interposer 230 described above, interposer 330 may be fabricated of a semiconductor material such as silicon. As a result, TSVs 335 may be through-silicon vias capable of providing a high density pad pitch for the first and/or second pluralities of upper interconnect pads 337 and 338, as well as for the first and/or second pluralities of lower interconnect pads 333 and 334. For example, the second plurality of upper interconnect pads 338 may have a pitch of approximately 50 um or less, such as a pitch of approximately 20 um to approximately 40 um.

Upper substrate segment 310a and 310b, and lower substrate segment 310c may be fabricated separately. As a result, fabrication equipment may be matched to the requirements of each substrate segment. Fabrication of upper substrate segment 310a and 310 may require equipment supporting a pad pitch of, for example, at least 130 um for the plurality of upper contact pads 312. By contrast, fabrication of lower substrate segment 310c may only require equipment supporting a pad pitch of, for example, at least 300 um for the plurality of lower contact pads 314. In other words, a minimum pad pitch of upper substrate segment 310a and 310b may be less than a minimum pad pitch of lower substrate segment 310c.

Figure 3B:
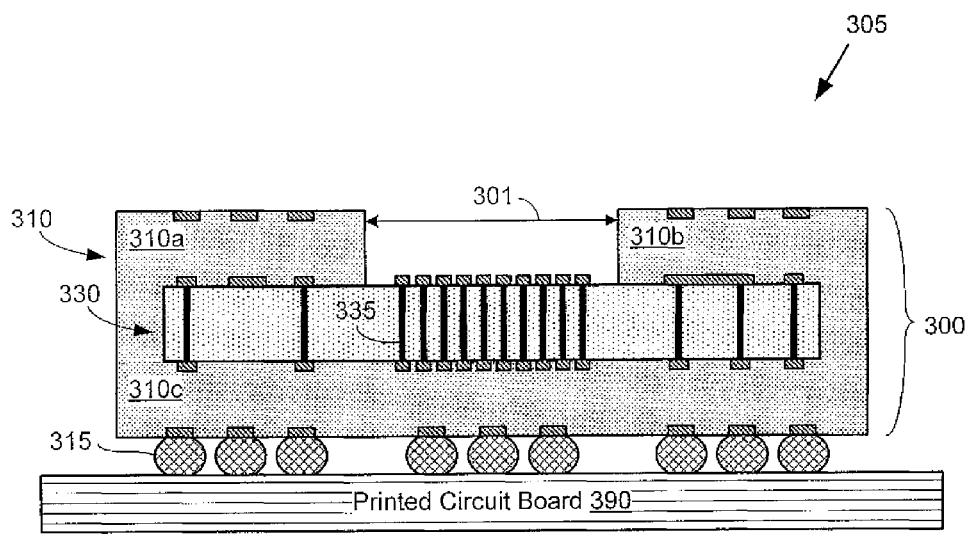
FIG. 3B presents a cross-sectional view of an exemplary semiconductor package including the interface substrate of FIG. 3A mounted on a support surface.

Continuing to FIG. 3B, FIG. 3B presents a cross-sectional view of an exemplary semiconductor package including interface substrate 300 mounted on PCB 390. Semiconductor package 305 (or "package 305") shows interface substrate 300 being mounted onto PCB 390 by solder balls 315, with an exemplary solder ball 315 explicitly identified as such. With respect to the detailed features of interface substrate 300, it is noted that interface substrate 300 in FIG. 3B, as well as subsequent FIGS. 3C and 3D, corresponds to interface substrate 300 in FIG. 3A. In other words, interface substrate 300 in FIGS. 3B, 3C, and 3D include the features previously attributed to interface substrate 300 by reference to FIG. 3A above. Moreover, it is reiterated that interposer 330 of interface substrate 300 has interposer width 331 less than lower width 311 of lower substrate segment 310c.

Figure 3C:
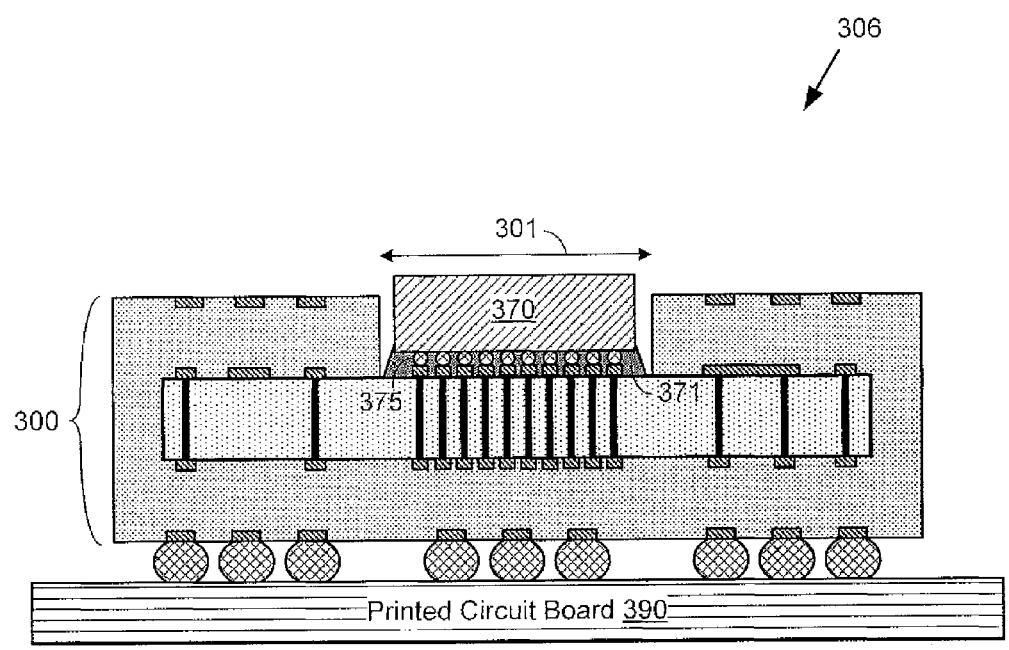
FIG. 3C presents a cross-sectional view of another exemplary semiconductor package including an organic substrate and an interposer having TSVs.

FIG. 3C presents a cross-sectional view of another exemplary semiconductor package including an organic substrate and an interposer having TSVs. Package 306 includes interface substrate 300 and upper semiconductor device 370, and is mounted on PCB 390. Upper semiconductor device 370 includes a plurality of microbumps 375, with an exemplary microbump 375 explicitly identified as such. Underfill 371 is situated below upper semiconductor device 370 to support and insulate the plurality of microbumps 375.

Opening 301 exposes the second plurality of upper interconnect pads 338 (as shown in FIG. 3A), which may function as upper contact pads for receiving upper semiconductor device 370. Upper semiconductor device 370 is shown to have a flip-chip configuration in the implementation of FIG. 3C. However, in other implementations, upper semiconductor device 370 may include a wire-bonded die, and corresponding upper contact pads or fingers for the wire bonds may be provided on upper substrate segment 310a and 310b.

Figure 3D:
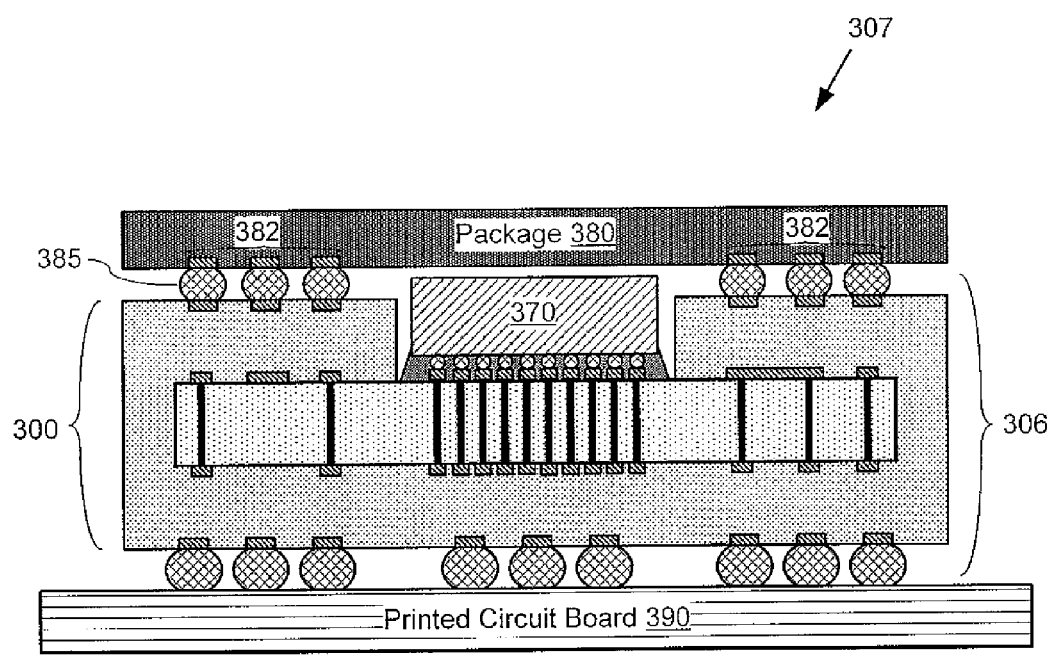
FIG. 3D presents a cross-sectional view of an exemplary semiconductor package-on-package including an organic substrate and an interposer having TSVs.

Continuing to FIG. 3D, FIG. 3D presents a cross-sectional view of an exemplary semiconductor package-on-package including an organic substrate and an interposer having TSVs. Package 307 of FIG. 3D may correspond to package 306 of FIG. 3C with the addition of upper package 380. Upper package 380 includes a plurality of solder balls 385, with an exemplary solder ball 385 explicitly identified as such. Thus, a package-on-package solution may be provided, with package 306 as the lower package and upper package 380 as the upper package. Upper package 380 may be any type of package, including a multi-die package.

Advantageously, because solder balls 385 may rest on an elevated surface provided by interface substrate 300, the size of solder balls 385 may be reduced while providing sufficient vertical clearance for upper package 380. Such a use of smaller solder balls 385 enables a reduced pitch size. Thus, the overall height of the package-on-package structure of package 307 may be reduced. As with the previous packaging examples, package 307 may optionally include a heat-sink and mold compound, which is omitted from FIG. 3D.

Figure 4:
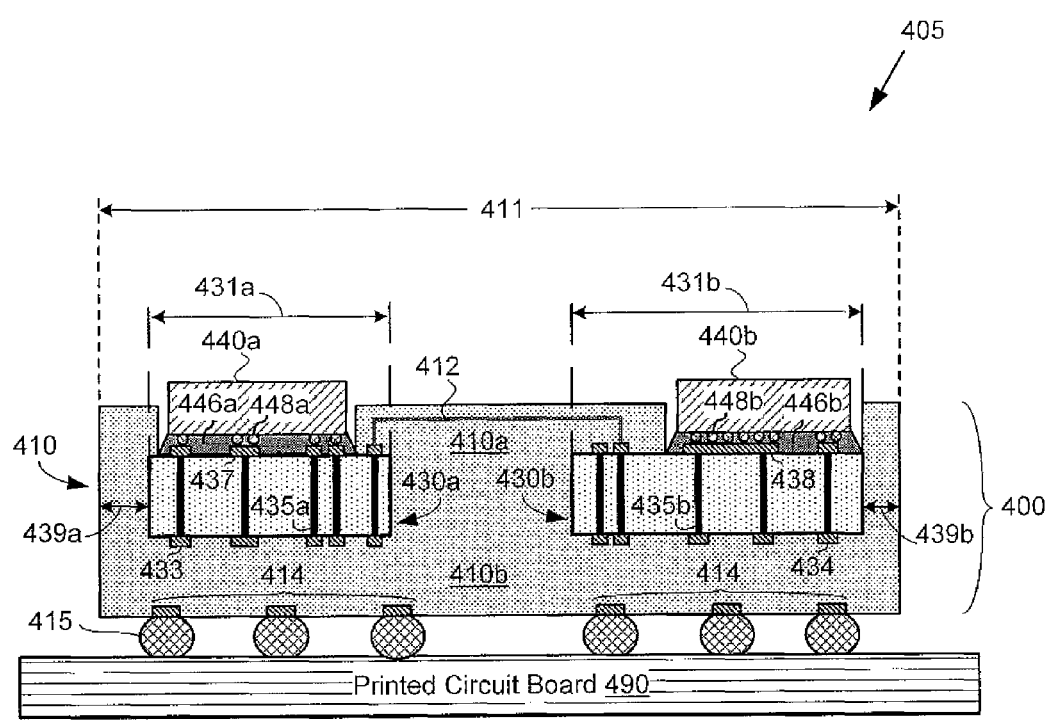
FIG. 4 presents a cross-sectional view of an exemplary semiconductor package including an organic substrate and multiple interposers having TSVs.

FIG. 4 presents a cross-sectional view of an exemplary semiconductor package including an organic substrate and multiple interposers having TSVs. Semiconductor package 405 (or "package 405") includes interface substrate 400 mounted on PCB 490. Interface substrate 400 includes contiguous organic substrate 410 having upper substrate segment 410a and lower substrate segment 410b. Interface substrate 400 also includes first interposer 430a and second interposer 430b, both of which are shown to be embedded in contiguous organic substrate 410. According to the present exemplary implementation, contiguous organic substrate 410 has a lateral width 411.

Lower substrate segment 410b includes first group of lower interconnect pads 433 under first interposer 430a, with an exemplary one of first group of lower interconnect pads 433 explicitly identified as such. Lower substrate segment 410b also includes second group of lower interconnect pads 434 under second interposer 430b, with an exemplary one of second group of lower interconnect pads 434 explicitly identified as such. In addition, lower substrate segment 410b includes a plurality of lower contact pads 414 coupled to a respective plurality of solder balls 415, with an exemplary solder ball 415 explicitly identified as such.

Upper substrate segment 410a includes first group of upper interconnect pads 437 over first interposer 430a, with an exemplary one of first group of upper interconnect pads 437 explicitly identified as such. First interposer 430a has a lateral first interposer width 431a and is inset by a distance 439a from an outer lateral edge of contiguous organic substrate 410. In addition, first interposer 430a includes first set of TSVs 435a, with an exemplary one of first set of TSVs 435a explicitly identified as such.

Upper substrate segment 410a also includes second group of upper interconnect pads 438 over second interposer 430b, with an exemplary one of second group of upper interconnect pads 438 explicitly identified as such. Second interposer 430b has a lateral second interposer width 431b and is offset by a distance 439b from an opposite outer lateral edge of contiguous organic substrate 410. In addition, second interposer 430b includes second set of TSVs 435b, with an exemplary one of second set of TSVs 435b explicitly identified as such. One or both of first and second interposers 430a and 430b may be fabricated of a semiconductor material such as silicon. As a result, one or both of first and second sets of TSVs 435a and 435b may be through-silicon vias.

As described above, first group of lower interconnect pads 433 is disposed under first interposer 430a, and second group of lower interconnect pads 434 is disposed under second interposer 430b. As further described above, first group of upper interconnect pads 437 is disposed over first interposer 430a, and second group of upper interconnect pads 438 is disposed over second interposer 430b. First group of lower interconnect pads 433 may be electrically connected to first group of upper interconnect pads 437 using first set of TSVs 435a to route the pads in any desired manner. Similarly, second group of lower interconnect pads 434 may be electrically connected to second group of upper interconnect pads 438 using second set of TSVs 435b to route the pads as desired.

Moreover, as shown by FIG. 4, at least one of first group of upper interconnect pads 437 is directly connected to at least one of second group of upper interconnect pads 438 through upper substrate segment 410a. According to the implementation of FIG. 4, such a direct connection is provided by wiring 412, which may be established using multiple conductive laminate or build-up layers of substrate segment 410a.

Package 405 also includes first flip-chip 440a mounted over first interposer 430a, and second flip-chip 440b mounted over second interposer 430b. As shown in FIG. 4, first flip-chip 440a is mounted over first interposer 430a using microbumps 448a, with one of microbumps 448a explicitly identified as such. Die attach material 446a is situated below first flip-chip 440a to support and insulate microbumps 448a. Second flip-chip 440b may be similarly mounted over second interposer 430b using microbumps 448b, with one of microbumps 448b explicitly identified as such. Die attach material 446b may be disposed below second flip-chip 440b to support and insulate microbumps 448b.

According to the implementation of FIG. 4, distance 439b is less than distance 439a. However, in other implementations, distance 439b may be greater than, or substantially equal to, distance 439a. Moreover, although first interposer width 431a is represented as less than second interposer width 431b in FIG. 4, in other implementations, first interposer width 431a may be greater than, or substantially equal to, second interposer width 431b. However, the sum of first interposer width 431a and second interposer width 431b is less than width 411 of contiguous organic substrate 410.

Upper substrate segment 410a and lower substrate segment 410b may be fabricated of organic materials such as BT, ABF, FR-4 laminates, E679-FBG, ECL4785GS, and E700. Upper substrate segment 410a may utilize the same materials as lower substrate segment 410b. In addition, as noted above, upper substrate segment 410a and lower substrate segment 410b may each include multiple conductive laminate or build-up layers for wiring.

Upper substrate segment 410a and lower substrate segment 410b may be fabricated separately. As a result, fabrication equipment may be matched to the requirements of each substrate segment. Accordingly, fabrication costs may be reduced in comparison to fabrication of a conventional organic substrate, where strict design rules may dictate the required fabrication equipment for substantially all layers of the interface substrate.

Thus, as demonstrated by the above examples, the use of one or more interposers having TSVs enables the continued use of low cost and widely deployed organic substrates in the fabrication of high density semiconductor packages. By providing a contiguous organic substrate including one or more embedded interposers, one or more semiconductor dies may be attached to exposed interconnect pads coupled to TSVs formed in the interposer(s). Such a configuration enables the use of flip-chips with high-density microbump arrays and the accommodation of dies with varied bump pitches. In addition, the contiguous organic substrate including one or more embedded interposers can be used to implement a package-on-package structure.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A semiconductor package comprising:
   a substrate having a lower substrate segment including a first plurality of lower interconnect pads;
   said substrate including an upper substrate segment having an upper width and including a first plurality of upper interconnect pads;
   an interposer for electrically connecting at least some of said first plurality of lower interconnect pads to at least some of said first plurality of upper interconnect pads;
   said interposer having an interposer width that is different from said upper width of said upper substrate segment.

2. The semiconductor package of claim 1, wherein a second plurality of lower interconnect pads are configured for use as contact pads for receiving a lower semiconductor die.

3. The semiconductor package of claim 2, further comprising said lower semiconductor die.

4. The semiconductor package of claim 1, wherein said upper substrate segment includes upper contact pads for receiving an upper semiconductor die.

5. The semiconductor package of claim 4, further comprising said upper semiconductor die.

6. The semiconductor package of claim 1, wherein a minimum pad pitch of said upper substrate segment is different from a minimum pad pitch of said lower substrate segment.

7. The semiconductor package of claim 1, wherein said interposer comprises silicon.

8. A semiconductor package comprising:
   a substrate having a lower substrate segment including a first and a second plurality of lower interconnect pads;
   said substrate including an upper substrate segment having an upper width and including a first and a second plurality of upper interconnect pads;
   an interposer for electrically connecting at least some of said first and second plurality of lower interconnect pads to at least some of said first and second plurality of upper interconnect pads;
   said interposer having an interposer width that is different from said upper width of said upper substrate segment.

9. The semiconductor package of claim 8, wherein said second plurality of lower interconnect pads are configured for use as contact pads for receiving a lower semiconductor die.

10. The semiconductor package of claim 9, further comprising said lower semiconductor die.

11. The semiconductor package of claim 8, wherein said upper substrate segment includes upper contact pads for receiving an upper semiconductor die.

12. The semiconductor package of claim 11, further comprising said upper semiconductor die.

13. The semiconductor package of claim 8, wherein a minimum pad pitch of said upper substrate segment is different from a minimum pad pitch of said lower substrate segment.

14. The semiconductor package of claim 8, wherein said interposer comprises silicon.

15. A semiconductor package comprising:
   a contiguous substrate having a lower substrate segment including a first and a second plurality of lower interconnect pads;
   said contiguous substrate also including an upper substrate segment having an upper width and including a first and a second plurality of upper interconnect pads;
   an interposer including through-semiconductor vias (TSVs) for electrically connecting at least some of said first and second plurality of lower interconnect pads to at least some of said first and second plurality of upper interconnect pads;
   said interposer having an interposer width that is different from said upper width of said upper substrate segment.

16. The semiconductor package of claim 15, wherein said second plurality of lower interconnect pads are configured for use as contact pads for receiving a lower semiconductor die.

17. The semiconductor package of claim 16, further comprising said lower semiconductor die.

18. The semiconductor package of claim 15, wherein said upper substrate segment includes upper contact pads for receiving an upper semiconductor die.

19. The semiconductor package of claim 18, further comprising said upper semiconductor die.

20. The semiconductor package of claim 15, wherein a minimum pad pitch of said upper substrate segment is different from a minimum pad pitch of said lower substrate segment.

* * * * *